United States Patent [19]

Banjo et al.

[11] Patent Number: 4,868,713
[45] Date of Patent: Sep. 19, 1989

[54] MEMORY CARD HOUSING A SMICONDUCTOR DEVICE

[75] Inventors: Toshinobu Banjo; Yasuhiro Murasawa; Shigeo Onoda, all of Itami City, Japan

[73] Assignee: Mitsubishi Denki Kabushiki Kaisha, Japan

[21] Appl. No.: 175,277

[22] Filed: Mar. 30, 1988

[30] Foreign Application Priority Data

Mar. 31, 1987 [JP] Japan ................................ 62-79920

[51] Int. Cl.⁴ ............................................... H05K 1/14
[52] U.S. Cl. ................................... 361/392; 220/4 E; 361/395; 200/303; 439/141; 235/492
[58] Field of Search ............... 361/212, 220, 345, 380, 361/391–393, 395, 399, 412, 424, 413, 417, 419, 420; 439/137, 140, 141; 206/387, 389; 220/344, 345, 4 B, 4 E; 200/307, 303; 365/52, 53, 54; 235/487, 492

[56] References Cited

U.S. PATENT DOCUMENTS

| | | | |
|---|---|---|---|
| 3,668,476 | 6/1972 | Wrabel | 361/395 |
| 3,908,852 | 9/1975 | Ricobene | 220/4 E |
| 3,950,603 | 4/1976 | Brefka | 220/4 B |
| 3,951,490 | 4/1976 | Devendorf | 361/395 |
| 4,525,802 | 6/1985 | Hackamack | 361/395 |
| 4,531,176 | 7/1985 | Beecher II | 361/395 |
| 4,597,291 | 7/1986 | Motomiya | 361/395 |
| 4,695,925 | 9/1987 | Kodai | 361/399 |
| 4,798,946 | 1/1989 | Fujii et al. | 235/492 |

Primary Examiner—Gerald P. Tolin
Attorney, Agent, or Firm—Leydig, Voit & Mayer

[57] ABSTRACT

A memory card comprises a plastic outer package which houses a semiconductor device and electrical connector. The outer package comprises a plurality of package sections which are stacked atop one another and bonded together along connecting surfaces formed on the outer peripheries of the package sections. The connecting surface of one package section of each pair of adjoining package sections has a projecting engaging portion formed thereon, and the connecting surface of the other package section of the pair of adjoining package sections has a recessed engaging portion formed therein which engages with the projecting engaging portion of the adjoining package section.

5 Claims, 1 Drawing Sheet

FIG. 1
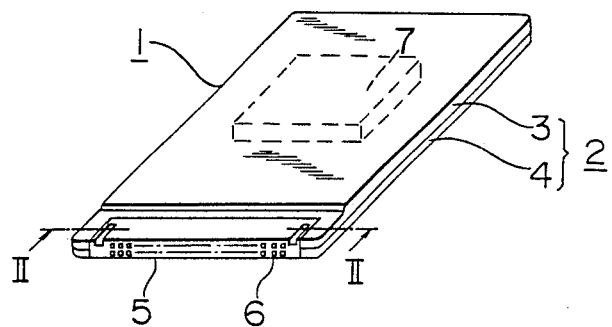
FIG. 2
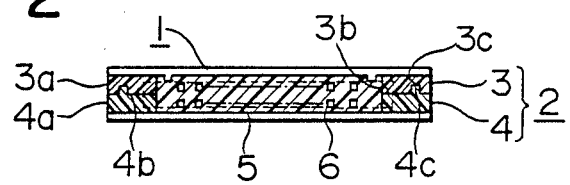
FIG. 3    FIG. 4
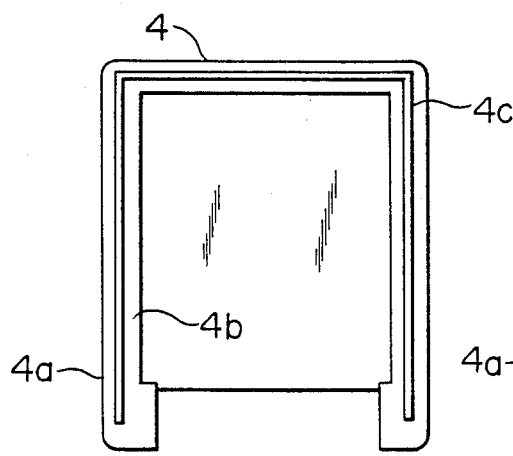 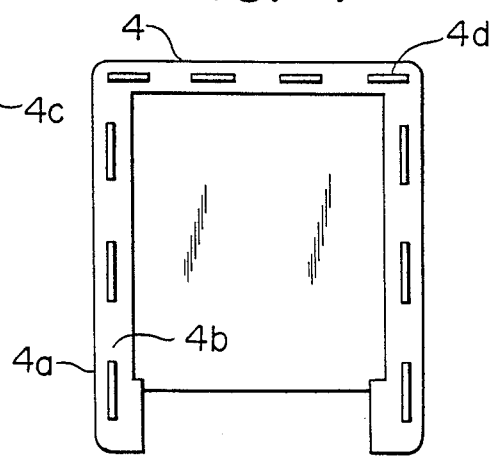
FIG. 5
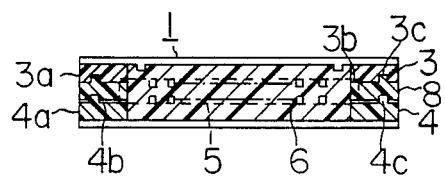

MEMORY CARD HOUSING A SMICONDUCTOR DEVICE

BACKGROUND OF THE INVENTION

This invention relates to a memory card which houses a semiconductor device, and more particularly to a memory card having an improved plastic outer package which can be more easily assembled and is stronger than the outer package of a conventional memory card.

In recent years, external memory devices have been developed which comprise a thin, card-like, plastic outer package which houses a semiconductor device and a connector for electrically connecting the semiconductor device to external equipment. These so-called memory cards have found widespread use as storage devices for data or programs for video games and microcomputers. Typically, the plastic outer package of a memory card consists of two hollow package sections which are stacked atop one another. Each package section has a raised rim which extends around its periphery, and the top of each rim is a flat, smooth surface which serves as a connecting surface along which the two package sections are joined together. The two package sections are secured to one another by applying a bonding agent to the connecting surfaces and pressing the connecting surface of one package section against the connecting surface of the other package section.

At the time of joining the two package sections together, due to the presence of a viscous bonding agent therebetween, the two package sections can easily become misaligned with respect to one another. Such misalignment greatly mars the appearance of the outer package, and in some cases the misalignment is serious enough to require the realignment of the package sections, thus increasing the complexity and cost of the assembly process.

SUMMARY OF THE INVENTION

Accordingly, it is an object of the present invention to provide a memory card having an outer package which can be easily assembled while maintaining perfect alignment among the package sections constituting the outer package.

It is another object of the present invention to provide a memory card having an outer package which is stronger than the outer package of a conventional memory card.

A memory card in accordance with the present invention comprises an outer package, a semiconductor device which is housed within the outer package, and an electrical connector which is housed within the front end of the outer package and is electrically connected to the semiconductor device. The outer package comprises a plurality of package sections which are stacked atop one another and bonded together on their confronting surfaces. Each package section has a rim which extends around its periphery, and each rim has a connecting surface formed thereon which confronts and is bonded to the connecting surface of the adjoining package section. The connecting surface of one package section of each pair of adjoining package sections which are bonded together has a projecting engaging portion formed thereon, and the connecting surface of the other package section of each pair has a recessed engaging portion formed therein which engages with the projecting engaging portion of the adjoining package section.

When the plurality of package sections are bonded together, the engaging portions position the package sections and properly align them with one another so that an outer package of good appearance can be obtained. Furthermore, the engaging portions increase the bonding area of the package sections and therefore increase the strength of the bond connecting the package sections.

BRIEF DESCRIPTION OF THE DRAWINGS

FIG. 1 is a perspective view of a first embodiment of a memory card in accordance with the present invention.

FIG. 2 is a cross-sectional view taken along Line II—II of FIG. 1.

FIG. 3 is a top view of the lower package section of FIG. 1.

FIG. 4 is a top view of the lower package section of a second embodiment of the present invention.

FIG. 5 is a cross-sectional view taken similarly to FIG. 2 but illustrating an alternative embodiment in accordance with the invention.

In the figures, the same reference numerals indicate the same or corresponding parts.

DESCRIPTION OF THE PREFERRED EMBODIMENTS

Hereinbelow, a number of preferred embodiments of a memory card in accordance with the present invention will be described while referring to the accompanying drawings, FIGS. 1 through 3 of which illustrate a first embodiment. As shown in FIG. 1, a memory card 1 has a rectangular outer package 2 which comprises an upper package section 3 and a lower package section 4 which are stacked atop one another. Both package sections 3 and 4 are made of an electrically-insulating material such as a synthetic resin. The front ends of the two package sections 3 and 4 support an electrical connector 5 having a plurality of sockets 6 formed therein. The sockets 6 are electrically connected to a semiconductor device 7 (shown in phantom lines) which is housed within the outer package 2. When the memory card 1 is used, it is inserted into an unillustrated memory card reader, and the sockets 6 of the connector 5 fit onto corresponding electrode pins of the connector of the memory card reader.

As shown in FIG. 2, the upper package section 3 has a flat base on the outer periphery of which a generally U-shaped raised rim 3a is formed. The rim 3a defines a recess inside of which the unillustrated semiconductor device is housed. The rim 3a has a flat lower surface which serves as a connecting surface 3b. A recessed engaging member in the form of a continuous groove 3c is formed in the connecting surface 3b along substantially its entire length. Similarly, the lower package section 4, which is shown in plan in FIG. 3, comprises a flat base on which is formed a generally U-shaped raised rim 4a which defines a recess for the unillustrated semiconductor device. The rim 4a has a flat upper surface which serves as a connecting surface 4b, and a projecting engaging portion in the form of a continuous projection 4c formed on the connecting surface 4b along substantially its entire length. The shape of the projection 4c of the lower package section 4 is complementary to that of the groove 3c in the upper package section 3.

The outer package 2 is assembled by applying a bonding agent to the connecting surfaces 3b and 4b and engaging portions 3c and 4c of the two package sections 3 and 4, positioning the package sections so that the connecting surfaces confront one another, and then pressing the two package sections against each other while inserting the projection 4c of the lower package section 4 into the groove 3c of the upper package section 3. When the projection 4c and the groove 3c are engaged with one another as shown in FIG. 2, the two package sections 3 and 4 are perfectly aligned with one another and an outer package 2 having a good appearance is obtained. Not only do the engaging portions prevent the two package sections from becoming misaligned, but they also help to position the package sections with respect to one another, so that assembly is made easier. Furthermore, if the bonding agent is applied to the engaging portions 3c and 4c, the surface area over which bonding is performed is enlarged, and the strength of the bond between the two package sections is correspondingly increased.

In the above-described embodiment, each engaging portion is a continuous groove or recess extending for substantially the entire length of the rim 3a or 4a in which it is formed. However, the engaging portions need not be continuous, as shown in FIG. 4, which is a plan view of the lower package section 4 of a second embodiment of the present invention. The lower package section 4 of this embodiment has a projecting engaging portion in the form of a plurality of discontinuous projections 4d which are formed on the connecting surface 4b and extend along its length. Similarly, the unillustrated upper package section of this embodiment has a recessed engaging portion in the form of a plurality of discontinuous grooves which are formed in the connecting surface of the upper package section, the discontinuous grooves corresponding to and mating with the projections 4d of the lower package section 4. Discontinuous engaging portions of this type provide the same benefits as the continuous engaging portions of FIG. 2 and 3. The structure of this embodiment is otherwise identical to that of the embodiment of FIG. 1.

In the illustrated embodiments, the engaging portions have a rectangular transverse cross section, but there is no restriction on the exact shape of the engaging portions.

An electrical connector for connecting the semiconductor device which is housed within the outer package 2 to external equipment need not be in the form of the connector 5 used in the preceding embodiments. For example, an electrical connector may be used which is in the form of a plurality of sockets which are provided in the front end of the surface of the outer package 2.

In addition, although the preceding embodiments both have an outer package 2 consisting of two package sections, there is no restriction on the number of package sections constituting the outer package of a memory card of the present invention. For example, as illustrated in FIG. 5 the outer package may comprise three layers stacked atop one another, i.e., an upper package section 3, a middle package section 8, and a lower package section. In this case, the connecting surface of each package section has an engaging portion formed therein which engages with the engaging portion of the adjoining package section.

Furthermore, in the preceding embodiments, the upper package section 3 has a recessed engaging portion and the lower package section 4 has a projecting engaging portion, but it is of course possible for the upper package section 3 to have a projecting engaging portion and the lower package section 4 to have a recessed engaging portion.

What is claimed is:

1. A memory card comprising:
   an electrical connector which is electrically connected to a semiconductor device and which can be electrically connected to an external device; and
   an outer package which houses the semiconductor device and said electrical connector, said outer package comprising a plurality of package sections which are stacked atop one another, each package section having a rim formed around its periphery which has a connecting surface formed thereon which confronts and is bonded to a complementary connecting surface of the adjoining package section with a bonding agent, one connecting surface of each pair of adjoining package sections having a recessed engaging portion formed therein and the other connecting surface of each pair of adjoining package sections having a projecting engaging portion formed thereon which is complementary to and engages said recessed engaging portion of said one connecting surface.

2. A memory card as claimed in claim 1, wherein said outer package comprises only an upper package section and a lower package section which are bonded to one another.

3. A memory card as claimed in claim 1, wherein said outer package comprises an upper package section, a lower package section, and a middle package section which is disposed between and bonded to said upper and lower package sections.

4. A memory card as claimed in claim 1, wherein said recessed engaging portion comprises a continuous groove and said projecting engaging portion comprises a continuous projection.

5. A memory card as claimed in claim 1, wherein said recessed engaging portion comprises a plurality of discontinuous grooves and said projecting engaging portion comprises a plurality of discontinuous projections, each of said projections engaging with one of said grooves.

* * * * *